(12) United States Patent
Lu

(10) Patent No.: US 9,083,843 B2
(45) Date of Patent: Jul. 14, 2015

(54) DISTRIBUTOR AMPLIFIER HAVING A NOISE BLOCKING CIRCUIT

(71) Applicant: Shan-Jui Lu, Xizhi (TW)

(72) Inventor: Shan-Jui Lu, Xizhi (TW)

(73) Assignee: LANTEK ELECTRONICS, INC., Xizhi (TW)

( * ) Notice: Subject to any disclaimer, the term of this patent is extended or adjusted under 35 U.S.C. 154(b) by 0 days.

(21) Appl. No.: 14/215,884

(22) Filed: Mar. 17, 2014

(65) Prior Publication Data

US 2014/0282812 A1    Sep. 18, 2014

Related U.S. Application Data

(60) Provisional application No. 61/788,386, filed on Mar. 15, 2013.

(51) Int. Cl.
*H04N 7/10*    (2006.01)
*H04N 7/16*    (2011.01)
*H04N 7/173*   (2011.01)
*H03F 99/00*   (2009.01)

(52) U.S. Cl.
CPC ............... *H04N 7/102* (2013.01); *H03F 21/00* (2013.01)

(58) Field of Classification Search
USPC .......................................... 725/121–129, 149
See application file for complete search history.

(56) References Cited

U.S. PATENT DOCUMENTS

| 6,049,693 | A  | * | 4/2000  | Baran et al.    | 725/124 |
| 8,850,505 | B2 | * | 9/2014  | Zilberberg      | 725/124 |
| 2005/0289632 | A1 | * | 12/2005 | Brooks et al.   | 725/126 |
| 2010/0095344 | A1 | * | 4/2010  | Newby et al.    | 725/125 |
| 2011/0164855 | A1 | * | 7/2011  | Crockett et al. | 386/230 |
| 2014/0380399 | A1 | * | 12/2014 | Zilberberg      | 725/125 |

* cited by examiner

*Primary Examiner* — Nathan Flynn
*Assistant Examiner* — Caroline Somera
(74) *Attorney, Agent, or Firm* — Law Offices of Eugene M. Cummings, P.C.

(57) ABSTRACT

A distributor amplifier having a noise blocking circuit, including: a first connector; a first filter; a transformer; a voltage scaling unit; a first amplifier; a detector; a second amplifier; a comparator; a switch circuit; and a second connector. The distributor amplifier is capable of suppressing and preventing upstream RF noise from entering a cable TV system.

15 Claims, 4 Drawing Sheets

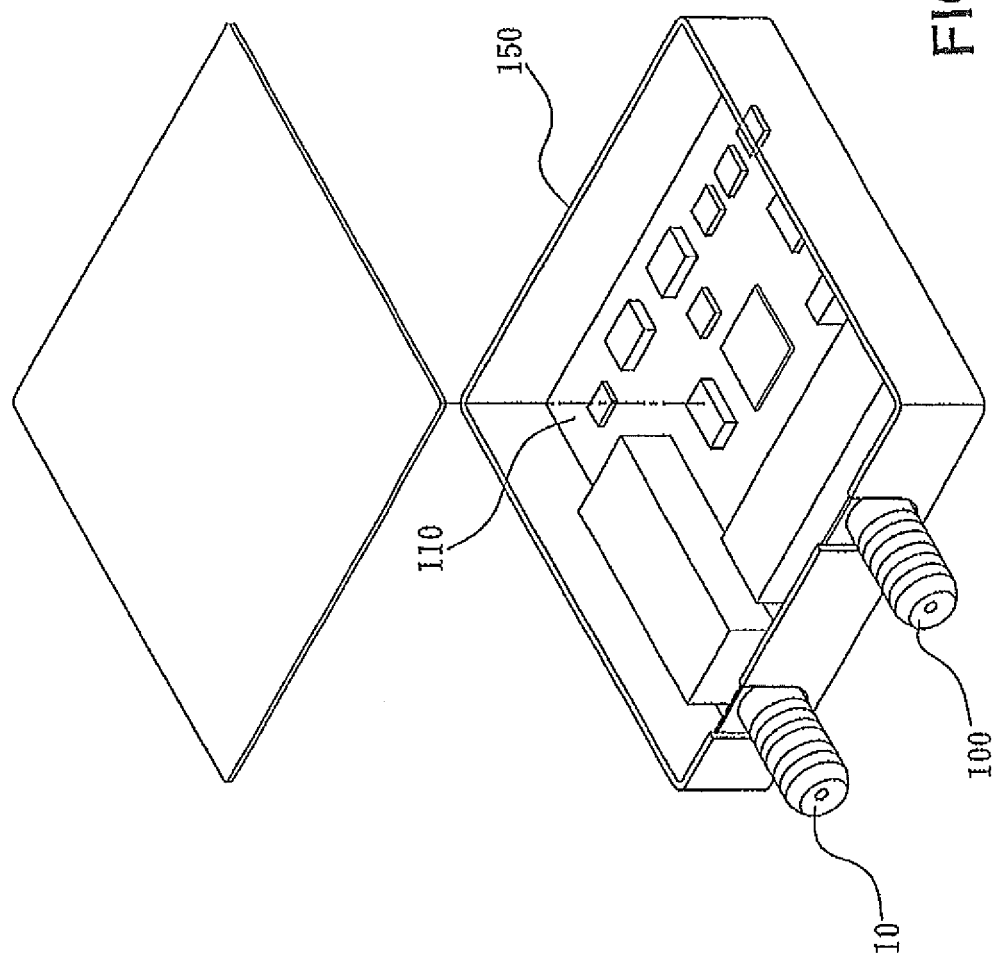

DISTRIBUTOR AMPLIFIER HAVING A NOISE BLOCKING CIRCUIT

CROSS-REFERENCE TO RELATED APPLICATION

This application claims benefit under 35 U.S.C. §119(e) of U.S. Provisional Application Ser. No. 61/788,386, entitled "DISTRIBUTOR AMPLIFIER HAVING A NOISE BLOCKING CIRCUIT," filed Mar. 15, 2013, naming Shan-Jui Lu as the inventor, the complete disclosure being incorporated herein by reference.

BACKGROUND OF THE INVENTION

1. Field of the Invention

The present invention relates to a distributor amplifier, especially to a distributor amplifier having a noise blocking circuit including a comparator and a switch circuit for suppressing and preventing upstream RF noise from entering a cable TV system via a cable.

2. Description of the Related Art

At present, a cable TV system generally provide a cable modem or a set top box for each client to download videos (at a frequency range of 54 MHZ-1000 MHZ), or upload data (at a frequency range of 5 MHZ-42 MHZ) to a host of the cable TV system.

Therefore, a coaxial cable can carry videos having a band of 54 MHz-1000 MHz and upstream RF data having a bandwidth of 5 MHz-42 MHz simultaneously. However, when a user uploads data, noise caused by a hair-drier or a vacuum cleaner, or resulted from other noise sources may accompany the data to enter a cable—for example but not limited to a coaxial cable, to degrade the data transmission.

Some prior art taps or distributors or house amplifiers use an EMI core to tackle noise. However, the effect is not satisfactory because the EMI core can only slightly suppress noise but not prevent noise from entering a cable.

In view of the foregoing problem of the prior art taps, distributors, or house amplifiers, the present invention proposes a distributor amplifier having a noise blocking circuit as a solution.

SUMMARY OF THE INVENTION

One objective of the present invention is to provide a distributor amplifier having a noise blocking circuit, which has a detector and an amplifier for detecting an upstream RF signal.

Another objective of the present invention is to provide a distributor amplifier having a noise blocking circuit, which has a comparator and a switch circuit for controlling a signal path to a cable for an upstream RF signal, wherein the signal path will be turned on when the upstream RF signal has an amplitude higher than a reference level, and shut down when an upstream transmission is over to prevent noise from entering the cable.

Still another objective of the present invention is to provide a distributor amplifier having a noise blocking circuit, which can be broadly applied to active or passive distributors.

To attain the foregoing objectives, a the present invention proposes a distributor amplifier having a noise blocking circuit, including: a first connector, used for inputting an RF signal; a first filter, coupled to the first connector for filtering the RF signal; a transformer, having a primary side coil and a secondary side coil, wherein the primary side coil has a first terminal coupled to an output terminal of the first filter for coupling the RF signal to the secondary side coil; a voltage scaling unit, having a first terminal coupled to a first terminal of the secondary side coil of the transformer for adjusting the amplitude of the RF signal; a first amplifier, having a first terminal coupled to a second terminal of the voltage scaling unit for amplifying the voltage amplitude of the RF signal; a detector, having a first terminal coupled to an output terminal of the first amplifier for detecting the RF signal; a second amplifier, coupled to an output terminal of the detector for further amplifying the voltage of the RF signal; a comparator for outputting a control signal, having a first input terminal and a second input terminal, the first input terminal being coupled with a reference voltage, the second input terminal being coupled to an output terminal of the second amplifier; a switch circuit, having a first terminal coupled to a second terminal of the primary side coil of the transformer, and a second terminal coupled with the control signal of the comparator, wherein the switch circuit is switched on or off by the control signal to control a signal path for the RF signal; and a second connector, coupled to a third terminal of the switch circuit for outputting the RF signal.

To make it easier for our examiner to understand the objective of the invention, its structure, innovative features, and performance, we use preferred embodiments together with the accompanying drawings for the detailed description of the invention.

BRIEF DESCRIPTION OF THE DRAWINGS

FIG. 4 is an illustrative diagram of a distributor amplifier having a noise blocking circuit according to still another preferred embodiment of the present invention, wherein the distributor further has a body.

DETAILED DESCRIPTION OF THE PREFERRED EMBODIMENTS

The present invention will be described in more detail hereinafter with reference to the accompanying drawings that show the preferred embodiments of the invention.

Figure 1:
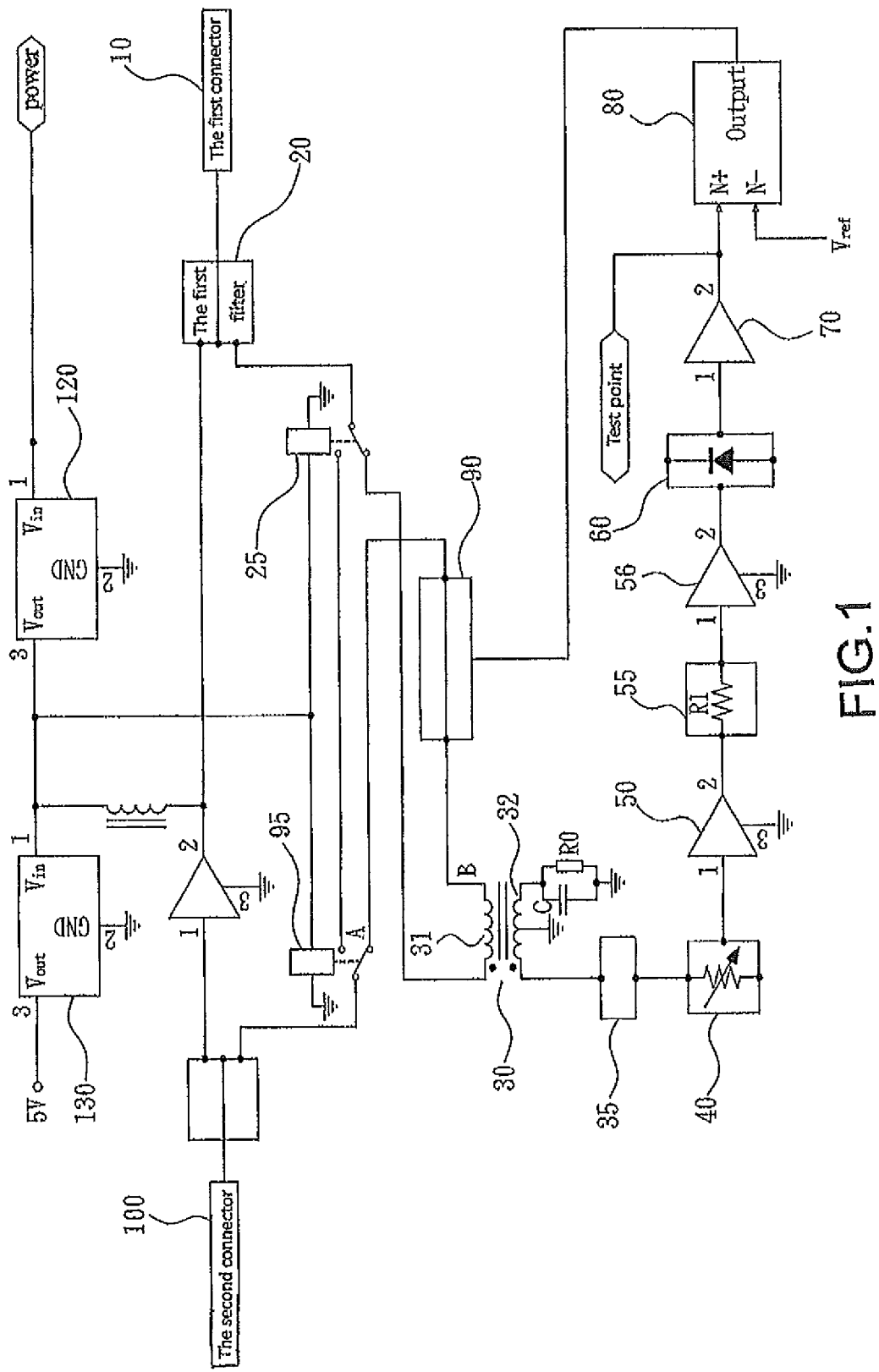
FIG. 1 illustrates a block diagram of a distributor amplifier having a noise blocking circuit according to a preferred embodiment of the present invention.
Figure 2:
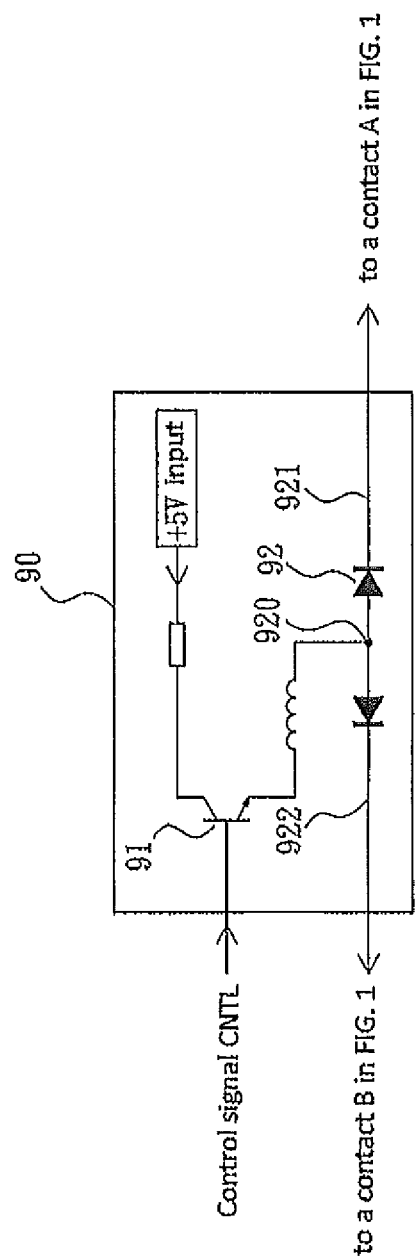
FIG. 2 illustrates a circuit diagram of the switch circuit in FIG. 1 according to a preferred embodiment of the present invention.
Figure 3:
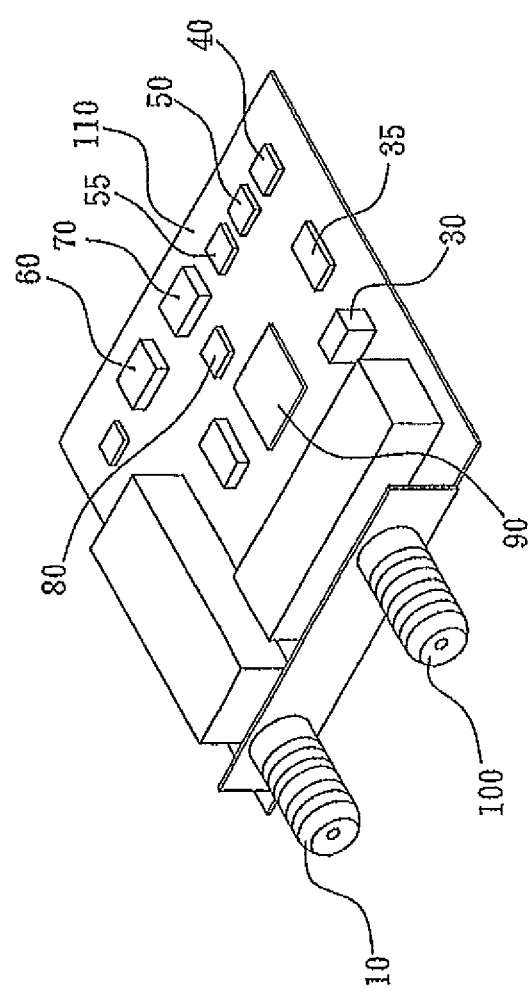
FIG. 3 is an illustrative diagram of a distributor amplifier having a noise blocking circuit according to another preferred embodiment of the present invention, wherein the distributor further has a printed circuit board.

Please refer to FIG. 1-4, wherein FIG. 1 illustrates a block diagram of a distributor amplifier having a noise blocking circuit according to a preferred embodiment of the present invention; FIG. 2 illustrates a circuit diagram of the switch circuit in FIG. 1 according to a preferred embodiment of the present invention; FIG. 3 is an illustrative diagram of a distributor amplifier having a noise blocking circuit and a printed circuit board according to another preferred embodiment of the present invention; FIG. 4 is an illustrative diagram of a distributor amplifier having a noise blocking circuit and a body according to still another preferred embodiment of the present invention.

As illustrated in the figures, the distributor amplifier having a noise blocking circuit of the present invention includes: a first connector 10; a first filter 20; a transformer 30; a voltage scaling unit 40; a first amplifier 50; a detector 60; a second amplifier 70; a comparator 80; a switch circuit 90; and a second connector 100.

The first connector 10 can be for example but not limited to an optical fiber connector (F-connector) or an Ethernet connector (RJ-45), for inputting an RF signal to a cable (not shown in the figures), the frequency range of the RF signal is for example but not limited to 5 MHz-42 MHz.

The first filter 20 is coupled to the first connector 10 for filtering the RF signal. The first filter 20 can be for example but not limited to a band-pass filter, with a pass band of, for example but not limited to 5 MHz-42 MHz.

The transformer 30 has a primary side coil 31 and a secondary side coil 32, wherein the primary side coil 31, having a first terminal coupled to an output terminal of the first filter 20, is used for coupling the RF signal to the secondary side coil 32.

The voltage scaling unit 40—for example but not limited to a variable resistor, having a first terminal coupled to a first terminal of the secondary side coil 32 of the transformer 30, and a second terminal coupled to the first amplifier 50, is used to adjust the amplitude of the RF signal.

The first amplifier 50, having a first terminal coupled to the second terminal of the voltage scaling unit 40, is used to amplify the voltage of the RF signal. The first amplifier 50 can be for example but not limited to a transistor based amplifier for providing a voltage gain of about 15 dB.

The detector 60, having a first terminal coupled to an output terminal of the first amplifier 50, is used for detecting the RF signal. The detector 60 can be, for example but not limited to a peak detector for detecting a peak value of the RF signal.

The second amplifier 70, having a first terminal coupled to an output terminal of the detector 60, is used to further amplify the voltage of the RF signal. The second amplifier 70 can be for example but not limited to an operational amplifier, and an output terminal of the second amplifier 70 can be used as a test point.

The comparator 80 has a first input terminal, a second input terminal, and an output terminal. The first input terminal is coupled with a reference voltage $V_{ref}$, for example but not limited to 1.5V, the second input terminal is coupled to the output terminal of the second amplifier 70, and the output terminal is used to provide a control signal CNTL. When the voltage at the output terminal of the second amplifier 70 is higher than or equal to $V_{ref}$, the control signal CNTL of the comparator 80 will be at a high level; and when the voltage at the output terminal of the second amplifier 70 is lower than $V_{ref}$, the control signal CNTL of the comparator 80 will be at a low level. The voltage scaling unit 40 can be used to adjust the voltage at the test point to a suitable level so that the comparator 80 can provide the control signal CNTL properly.

The switch circuit 90, having a first terminal coupled to a second terminal of the primary side coil 31 of the transformer 30, and a second terminal coupled with the control signal CNTL from the comparator 80, can be switched on or off by the control signal to determine a passage of the RF signal.

The second connector 100, coupled to a third terminal (an output terminal) of the switch circuit 90, can be for example but not limited to an optical fiber connector (F-connector) or an Ethernet connector (RJ-45 connector) for outputting the RF signal. The first connector 10 and the second connector 100 can be of same type (both are optical fiber connectors or RJ-45 connectors, for example), or different types (one is an optical fiber connector and the other is an RJ-45 connector, for example).

As illustrated in FIG. 2, the switch circuit 90 further includes: a transistor 91 and a pin diode 92. The transistor 91 can be for example but not limited to an NPN transistor, having a first terminal coupled with the control signal CNTL, a second terminal coupled to an anode of the pin diode 92, and a third terminal coupled to a DC power of 5V, wherein the first terminal is a base, the second terminal is an emitter, and the third terminal is a collector. The pin diode 92, composed of two diodes, has a common anode 920 coupled to the second terminal of the transistor 91 via a coil, a first cathode 921 coupled to a contact A in FIG. 1, and a second cathode 922 coupled to a contact B in FIG. 1.

When the control signal CNTL of the comparator 80 is at a high level, the voltage between the base and the emitter of the transistor 91 will be larger than 0.7V to turn on the transistor 91 and thereby switch on the pin diode 92, and the RF signal will pass through the first cathode 921 of the pin diode 92 and then the second connector 100, to enter a cable.

When the control signal CNTL of the comparator 80 is at a low level, the voltage between the base and the emitter of the transistor 91 will be smaller than 0.7V to turn off the transistor 91 and thereby switch off the pin diode 92, so that the RF signal will not reach the second connector 100 and noise can be prevented from entering the cable.

As illustrated in FIG. 3, a printed circuit board 110 is used to carry the first connector 10, the first filter 20, the transformer 30, the voltage scaling unit 40, the first amplifier 50, the detector 60, the second amplifier 70, the comparator 80, the switch circuit 90, and the second connector 100 in a distributor amplifier having a noise blocking circuit according to another preferred embodiment of the present invention. As the printed circuit board 110 is well known and not the key point of the present invention, it will not be addressed further.

Please refer back to FIG. 1-2, the distributor amplifier having a noise blocking circuit further has a first switch 25 and a second switch 95, wherein, the first switch 25, placed on the printed circuit board 110 and located between the first filter 20 and the primary side coil 31 of the transformer 30, has a first terminal (a common terminal) coupled to the output terminal of the first filter 20, and a second terminal coupled to the first terminal of the primary side coil 31 for controlling a passage of the RF signal to the transformer 30; the second switch 95, placed on the printed circuit board 110 and located between the first switch 25, the switch circuit 90, and the second connector 100, has a first terminal (a common terminal) coupled to the input terminal of the second filter 100, a second terminal (the contact A in FIG. 1) coupled to the first cathode 921 of the pin diode 92, and a third terminal coupled to a third terminal of the first switch 25. The second switch 95 is used to control a passage of the RF signal to the second connector 100. The first switch 25 and the second switch 95 are for example but not limited to electric switches.

Besides, the distributor amplifier having a noise blocking circuit of the present invention further has a second filter 35 placed on the printed circuit board 110 and located between the transformer 30 and the voltage scaling unit 40. The second filter 35 can be a band-pass filter for further providing a 5 MHz-42 MHz band-pass filtering effect on the RF signal output from the transformer 30.

Besides, the distributor amplifier having a noise blocking circuit of the present invention further has an attenuator 55 located between the first amplifier 50 and the detector 60. The attenuator 55, for example but not limited to a resistor, has a first terminal coupled to the output terminal of the first amplifier 50 for attenuating the RF signal.

Besides, the distributor amplifier having a noise blocking circuit of the present invention further has a third amplifier 56 located between the attenuator 55 and the detector 60. The third amplifier 56, having a first terminal coupled to an output terminal of the attenuator 55, and an output terminal coupled to the first terminal of the detector 60, is used to further amplify the voltage of the RF signal. The third amplifier 56 can be for example but not limited to a transistor based amplifier, capable of providing a voltage gain of 20 dB for the RF signal from the attenuator 55.

Please refer to table 1, which illustrates a set of measured data of the voltage level of an input RF signal, the voltage level at the output terminal of the detector 60, and the voltage level at the output terminal of the second amplifier 70.

TABLE 1

| The voltage level of an input RF signal dBmV | The voltage level at the output terminal of the detector 60 Vdc | The voltage level at the output terminal of the second amplifier 70 Vdc |
| --- | --- | --- |
| 25 | 0.06 | 0.48 |
| 26 | 0.07 | 0.61 |
| 27 | 0.08 | 0.68 |
| 28 | 0.09 | 0.74 |
| 29 | 0.10 | 0.82 |
| 34 | 0.18 | 1.47 |
| 35 | 0.21 | 1.67 |
| 36 | 0.24 | 1.94 |
| 38 | 0.28 | 2.52 |
| 40 | 0.41 | 3.27 |
| 41 | 0.48 | 3.80 |
| 42 | 0.55 | 4.34 |
| 43 | 0.63 | 4.86 |
| 44 | 0.72 | 4.86 |
| 45 | 0.82 | 4.86 |
| 50 | 1.58 | 4.86 |
| 51 | 1.79 | 4.86 |
| 55 | 2.63 | 4.86 |

As can be seen from table 1, when the voltage level of the input RF signal is at 34 dBmV, the voltage level at the output terminal of the detector 60 is at 0.18 V, and the voltage level at the output terminal of the second amplifier 70 is at 1.47 V. With the reference voltage $V_{ref}$ set at 1.5 V, the control signal CNTL generated by the comparator 80 will be at a low level due to a fact that the voltage level at the output terminal of the second amplifier 70 is lower than the reference voltage V. With the control signal CNTL at a low level, the transistor 91 and the pin switch 92 will be switched off to shut down a passage of the RF signal to the second connector 100, and prevent noise from entering a cable accordingly.

When the voltage level of the input RF signal is at 35 dBmV, the voltage level at the output terminal of the detector 60 is at 0.21 V, and the voltage level at the output terminal of the second amplifier 70 is at 1.67 V. With the reference voltage $V_{ref}$ set at 1.5 V, the control signal CNTL generated by the comparator 80 will be at a high level due to a fact that the voltage level at the output terminal of the second amplifier 70 is higher than the reference voltage $V_{ref}$. With the control signal CNTL at a high level, the transistor 91 and the pin switch 92 will be switched on, and the RF signal will be allowed to reach the second connector 100 via the first switch 25 and the second switch 95 accordingly.

With the design of the present invention, an engineer or a technician can adjust the resistance of the voltage scaling unit 40 to set the voltage level at the test point according to a signal-to-noise (S/N) ratio of a cable (with an error bound of for example but not limited to ±3 dB), so as to determine a passage of an upstream RF signal. When the S/N ratio is at a high value, noise can be perfectly blocked from entering a cable. However, if the S/N ratio is at an extremely low value, even with the voltage level at the test point being raised pretty high, noise can still accompany the upstream RF signal to enter the cable.

Besides, the distributor amplifier having a noise blocking circuit of the present invention further has a first regulator 120 and a second regulator 130. The first regulator 120 has a first terminal coupled to a first DC power, and a second terminal for providing a second DC power, wherein the second DC power can be used to supply power for the first switch 25 and the second switch 95.

The second regulator 130 has a first terminal coupled to the second DC power, and a second terminal for outputting a third DC power to supply power for the first amplifier 50, the second amplifier 70, the third amplifier 56, and the comparator 80.

The first DC power can be for example but not limited to 12V, the second DC power can be for example but not limited to 9V, and the third DC power can be for example but not limited to 5V.

When in operation, the amplitude of an upstream RF signal from the first connector 10 will be amplified by the second amplifier 70. If the voltage at the test point is higher than the reference voltage $V_{ref}$, the comparator 80 will output a high level through the control signal CNTL to switch on the transistor 91 and the pin diode 92, so that the RF signal can travel through the first switch 25 and the second switch 95 to reach the second connector 100, and thereby enter the cable. If the voltage at the test point is lower than the reference voltage $V_{ref}$, the comparator 80 will output a low level through the control signal CNTL to switch off the transistor 91 and the pin diode 92, so that the RF signal will be prohibited from traveling through the first switch 25 and the second switch 95 to reach the second connector 100, and noise will be blocked from entering the cable accordingly. Therefore, compared with the distributors of prior art, the distributor amplifier having a noise blocking circuit of the present invention has the advantage of blocking noise from entering a cable no matter if it is in an upstream transmission or not. Besides, the distributor amplifier having a noise blocking circuit of the present invention can be broadly applied to active/passive distributors.

In still another preferred embodiment, as illustrated in FIG. 4, the distributor amplifier having a noise blocking circuit of the present invention further has a body 150 for accommodating the printed circuit board 110, the first connector 10, the second connector 100, and other components. The body 150 can be made of, for example but not limited to a plastic material.

As a result, the distributor amplifier having a noise blocking circuit of the present invention is capable of blocking noise from entering a cable, and providing power for other distributors, taps or amplifiers simultaneously.

In conclusion, the distributor amplifier having a noise blocking circuit of the present invention is capable of detecting an upstream RF signal by a detector and an amplifier; by using a comparator and a switch circuit, it can enable a passage of the upstream RF signal to a cable when the voltage level of the upstream RF signal is higher than a reference level, and switch off the switch circuit when the transmission of the upstream RF signal is over to prevent noise entering the cable; and it can be broadly applied to active/passive distributors. Therefore, the present invention has improved the prior art distributors, taps, or amplifiers.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A distributor amplifier having a noise blocking circuit, comprising:
   a first connector, used for inputting an RF signal;
   a first filter, coupled to said first connector for performing a filtering operation on said RF signal;
   a transformer, having a primary side coil and a secondary side coil, wherein said primary side coil has a first terminal coupled to an output terminal of said first filter for coupling said RF signal to said secondary side coil;
   a voltage scaling unit, having a first terminal coupled to a first terminal of said secondary side coil of said transformer for setting a voltage level of said RF signal;
   a first amplifier, having a first terminal coupled to a second terminal of said voltage scaling unit for amplifying the voltage of said RF signal;
   a detector, having a first terminal coupled to an output terminal of said first amplifier for detecting said RF signal;
   a second amplifier, coupled to an output terminal of said detector for further amplifying the voltage of said RF signal;
   a comparator, having a first input terminal and a second input terminal, said first input terminal being coupled with a reference voltage, said second input terminal being coupled to an output terminal of said second amplifier, and said comparator being used for providing a control signal;
   a switch circuit, having a first terminal coupled to a second terminal of said primary side coil of said transformer, and a second terminal coupled with said control signal from said comparator, wherein said switch circuit is switched on or off by said control signal to determine a passage of said RF signal; and
   a second connector, coupled to a third terminal of said switch circuit for outputting said RF signal.

2. The distributor amplifier having a noise blocking circuit as claim 1, wherein each of said first connector and said second connector is a connector selected from a group consisting of an optical fiber connector and an RJ-45 connector.

3. The distributor amplifier having a noise blocking circuit as claim 1, wherein said RF signal has a frequency range of 5 MHz-42 MHz, and said first filter is a band-pass filter.

4. The distributor amplifier having a noise blocking circuit as claim 1, further comprising a first switch, placed between said first filter and said transformer, and having a first terminal coupled to said output terminal of said first filter and a second terminal coupled to said first terminal of said primary side coil of said transformer, wherein said first switch is an electric switch capable of determining a passage of said RF signal.

5. The distributor amplifier having a noise blocking circuit as claim 4, further comprising a second filter, placed between said first filter and said transformer, and having a first terminal coupled to said output terminal of said first filter and a second terminal coupled to said first terminal of said primary side coil of said transformer, wherein said first switch is an electric switch capable of determining a passage of said RF signal.

6. The distributor amplifier having a noise blocking circuit as claim 5, further comprising an attenuator, placed between said first amplifier and said detector, and having a first terminal coupled to said output terminal of said first amplifier and a second terminal coupled to said first terminal of said detector, wherein said attenuator is used for attenuating said RF signal.

7. The distributor amplifier having a noise blocking circuit as claim 6, further comprising a third amplifier, placed between said attenuator and said detector, and having a first terminal coupled to said second terminal of said attenuator and an output terminal coupled to said first terminal of said detector, wherein said third amplifier is used for further amplifying the voltage of said RF signal, said first amplifier and said third amplifier are transistor based amplifiers, and said second amplifier is an operational amplifier.

8. The distributor amplifier having a noise blocking circuit as claim 6, wherein said detector is a peak detector, said attenuator is a resistor.

9. The distributor amplifier having a noise blocking circuit as claim 7, further comprising a printed circuit board for carrying said first connector, said first filter, said first switch, said transformer, said first amplifier, said attenuator, said second amplifier, said detector, said third amplifier, said comparator, said switch circuit, and said second connector.

10. The distributor amplifier having a noise blocking circuit as claim 7, further comprising a second switch, placed on said printed circuit board and located between said first switch, said switch circuit, and said second connector, wherein said second switch is an electric switch for determining a passage of said RF signal to said second connector.

11. The distributor amplifier having a noise blocking circuit as claim 1, wherein said voltage scaling unit is a variable resistor.

12. The distributor amplifier having a noise blocking circuit as claim 10, further comprising:
   a first regulator, having a first terminal coupled to a first DC power, and a second terminal for outputting a second DC power, wherein said second DC power supplies power for said first switch and said second switch; and
   a second regulator, having a first terminal coupled to said second DC power, and a second terminal for outputting a third DC power, wherein said third DC power supplies power for said first amplifier, said second amplifier, said third amplifier, and said comparator.

13. The distributor amplifier having a noise blocking circuit as claim 12, wherein said first DC power is of 12V, said second DC power is of 9V, and said third DC power is of 5V.

14. The distributor amplifier having a noise blocking circuit as claim 12, further comprising a body for accommodating said printed circuit board, said first connector, and said second connector.

15. The distributor amplifier having a noise blocking circuit as claim 14, wherein said body is made of a plastic material.

* * * * *